(12) United States Patent
Kong et al.

(10) Patent No.: US 11,823,911 B2
(45) Date of Patent: Nov. 21, 2023

(54) PROCESS OF PACKAGE-THEN-ETCH THREE-DIMENSIONAL PACKAGE STRUCTURE ELECTRICALLY CONNECTED BY PLATED COPPER PILLARS

(71) Applicant: JIANGSU CHANGJIANG ELECTRONICS TECHNOLOGY CO., LTD., Jiangsu (CN)

(72) Inventors: Haishen Kong, Jiangyin (CN); Yubin Lin, Jiangyin (CN); Jinxin Shen, Jiangyin (CN); Xinfu Liang, Jiangyin (CN); Qingyun Zhou, Jiangyin (CN)

(73) Assignee: JIANGSU CHANGJIANG ELECTRONICS TECHNOLOGY CO., LTD., Jiangsu (CN)

( * ) Notice: Subject to any disclaimer, the term of this patent is extended or adjusted under 35 U.S.C. 154(b) by 61 days.

(21) Appl. No.: 17/537,335

(22) Filed: Nov. 29, 2021

(65) Prior Publication Data
US 2022/0084841 A1    Mar. 17, 2022

Related U.S. Application Data

(63) Continuation of application No. 16/471,904, filed as application No. PCT/CN2017/116053 on Dec. 14, 2017, now Pat. No. 11,217,459.

(30) Foreign Application Priority Data
Dec. 21, 2016   (CN) .......................... 201611192921.8

(51) Int. Cl.
*H01L 21/48*   (2006.01)
*H01L 21/56*   (2006.01)
(Continued)

(52) U.S. Cl.
CPC .......... *H01L 21/486* (2013.01); *H01L 21/561* (2013.01); *H01L 21/568* (2013.01);
(Continued)

(58) Field of Classification Search
CPC ... H01L 21/486; H01L 21/561; H01L 21/568; H01L 23/055; H01L 23/057;
(Continued)

(56) References Cited

U.S. PATENT DOCUMENTS

2008/0055859 A1   3/2008   Furukawa et al.
2013/0075884 A1   3/2013   Gong et al.
(Continued)

FOREIGN PATENT DOCUMENTS

CN   102104033 A   9/2011
CN   102176420 A   9/2011
(Continued)

OTHER PUBLICATIONS

International Search Report for PCT/CN2017/116053 dated Mar. 21, 2018 with English translation provided by WIPO.
(Continued)

*Primary Examiner* — Matthew E Warren
(74) *Attorney, Agent, or Firm* — Ladas & Parry, LLP

(57) ABSTRACT

The present invention relates to a process of a package-then-etch three-dimensional package structure electrically connected by plated copper pillars. The process comprises the following steps: taking a metal carrier; preplating a surface of the metal carrier with a copper layer; forming an outer metal pin by means of electroplating; performing plastic packaging with epoxy resin; forming a metal circuit layer by means of electroplating; forming a conductive metal pillar by means of electroplating; surface-mounting a chip; performing plastic packaging; surface-mounting a passive device; performing plastic packaging; etching and window-
(Continued)

ing the carrier; forming an anti-oxidant metal layer by means of electroplating; and performing cutting to obtain a finished product. The integration level and the reliability can be improved.

18 Claims, 6 Drawing Sheets

(51) Int. Cl.

| | | |
|---|---|---|
| *H01L 25/16* | (2023.01) | |
| *H01L 23/057* | (2006.01) | |
| *H01L 23/31* | (2006.01) | |
| *H01L 23/64* | (2006.01) | |
| *H01L 23/055* | (2006.01) | |

(52) U.S. Cl.
CPC .......... *H01L 23/055* (2013.01); *H01L 23/057* (2013.01); *H01L 23/3107* (2013.01); *H01L 23/3135* (2013.01); *H01L 23/3192* (2013.01); *H01L 23/64* (2013.01); *H01L 23/642* (2013.01); *H01L 23/645* (2013.01); *H01L 25/16* (2013.01)

(58) Field of Classification Search
CPC ............. H01L 23/3107; H01L 23/3135; H01L 23/3192; H01L 23/64; H01L 23/642; H01L 23/645; H01L 23/647; H01L 25/16
See application file for complete search history.

(56) References Cited

U.S. PATENT DOCUMENTS

| | | | |
|---|---|---|---|
| 2013/0320533 A1 | 12/2013 | Tao et al. | |
| 2015/0235916 A1 | 8/2015 | Chou et al. | |
| 2016/0141233 A1* | 5/2016 | Liang | H01L 24/97 |
| | | | 257/676 |
| 2016/0148861 A1* | 5/2016 | Liang | H01L 24/03 |
| | | | 257/676 |
| 2016/0219714 A1 | 7/2016 | Hsu et al. | |
| 2016/0247761 A1 | 8/2016 | Song et al. | |
| 2017/0077022 A1 | 3/2017 | Scanlan et al. | |
| 2017/0338174 A1 | 11/2017 | Hu et al. | |
| 2017/0345805 A1 | 11/2017 | Chevrier et al. | |
| 2018/0053755 A1* | 2/2018 | Cho | H01L 23/49811 |
| 2018/0076166 A1* | 3/2018 | Yu | H01L 23/49811 |
| 2018/0151392 A1* | 5/2018 | Chew | H01L 25/105 |
| 2018/0308829 A1* | 10/2018 | Huang | H05K 1/188 |

FOREIGN PATENT DOCUMENTS

| | | | | |
|---|---|---|---|---|
| CN | 202651072 U | 1/2013 | | |
| CN | 102176419 A | 3/2013 | | |
| CN | 103441111 A | 12/2013 | | |
| CN | 106531645 A | 3/2017 | | |
| CN | 106601627 A | 4/2017 | | |
| CN | 106601631 A | 4/2017 | | |
| WO | WO-2015018145 A1 * | 2/2015 | ......... | H01L 21/0273 |
| WO | WO-2015018174 A1 * | 2/2015 | ......... | H01L 21/4825 |

OTHER PUBLICATIONS

Written Opinion of the International Search Authority for PCT/CN2017/116053 dated Mar. 21, 2018 with English translation provided by Google Translate.
Non-Final Rejection in the U.S. Appl. No. 16/471,904, dated Dec. 21, 2020.
Notice of Allowance in the U.S. Appl. No. 16/471,904, dated Sep. 1, 2021.
Ex Parte Quayle Action in the U.S. Appl. No. 16/471,904, issued on Jun. 22, 2021.
Requirement for Restriction/Election in U.S. Appl. No. 16/471,904, dated Aug. 13, 2020.

* cited by examiner

PROCESS OF PACKAGE-THEN-ETCH THREE-DIMENSIONAL PACKAGE STRUCTURE ELECTRICALLY CONNECTED BY PLATED COPPER PILLARS

CROSS-REFERENCE TO RELATED APPLICATIONS

The present application is the Continuation application of U.S. Ser. No. 16/471,904 filed on Jun. 20, 2019, which is the U.S. national phase application of PCT Application No. PCT/CN2017/116053 filed on Dec. 14, 2017, which claims priority to Chinese Patent Application No. 201611192921.8, filed on Dec. 21, 2016 and entitled "Process of Package-before-Etch Three-dimensional Package Structure Electrically Connected by Plated Copper Pillars", the entire contents of which are incorporated herein by reference in their entireties.

TECHNICAL FIELD

The present invention relates to a package-then-etch three-dimensional package structure electrically connected by plated copper pillars and belongs to the field of semiconductor packaging technologies.

BACKGROUND

In order to meet the demand for small and light semiconductor packaging, nowadays, packaging of a metal lead frame or an organic substrate is working in two directions: 1, reduction of the package size; and 2, functional integration. For reduction of the package size, there is a limited space for improvement. Thus, the packaging industry is focused on improvement of functional integration. That is, part of functional components or other electronic devices are integrated inside a substrate by means of embedding to improve the functional integration level of an entire package. However, since the substrate with the components embedded therein has more complicated and diversified interlayer materials and different materials have significantly different thermal expansion coefficients, the whole substrate is serious in warping and aggravated in layering, and even, delamination may be caused.

SUMMARY

The present invention aims to solve the technical problem by providing a package-then-etch three-dimensional package structure electrically connected by plated copper pillars and a process thereof for the prior art. The three-dimensional package structure allows components to be embedded therein so as to improve the functional integration level of an entire package. A circuit layer prepared by the process is encapsulated at one side of a metal carrier. The metal carrier is reserved in the process flow, such that the product reliability can be improved.

The present invention adopts the following technical solution to solve the problem: a process of a package-then-etch three-dimensional package structure electrically connected by plated copper pillars includes:

step 1, taking a metal carrier;

step 2, preplating a surface of the metal carrier with a copper layer;

step 3, forming an outer metal pin by means of electroplating:

forming the outer metal pin on the front side of the metal carrier by means of electroplating;

step 4, performing plastic packaging with epoxy resin:

performing plastic packaging on a peripheral region of the outer metal pin with epoxy resin for protection, and enabling the top end of the outer metal pin to be exposed outside a surface of a molding compound by means of surface grinding;

step 5, forming a metal circuit layer by means of electroplating:

forming the metal circuit layer on the surface of the molding compound in step 4 by means of chemical plating or electroplating;

step 6, forming a conductive metal pillar by means of electroplating:

forming the conductive metal pillar on a surface of the metal circuit layer by means of electroplating;

step 7, surface-mounting a chip:

mounting the chip on the surface of the metal circuit layer;

step 8, performing plastic packaging:

performing plastic packaging on peripheral regions of the metal circuit layer, the conductive metal pillar and the chip by means of a molding compound, and enabling the top end of the conductive metal pillar to be exposed outside a surface of the molding compound by means of surface grinding;

step 9, surface-mounting a passive device:

surface-mounting the passive device at the top end of the conductive metal pillar exposed in step 8;

step 10, performing plastic packaging:

performing plastic packaging on a peripheral region of the passive device by a molding compound;

step 11, etching and windowing the carrier:

etching and windowing the back side of the metal carrier to expose the back side of the outer metal pin;

step 12, forming an anti-oxidant metal layer by means of electroplating:

forming the anti-oxidant metal layer on the exposed back side of the outer metal pin by means of electroplating; and step 13, performing cutting to obtain a finished product:

cutting a semi-finished product electroplated with the anti-oxidant metal layer in step 12, such that plastic package modules which are originally integrated by means of array aggregation are independently cut off to produce the finished product of the package-then-etch three-dimensional package structure electrically connected by the plated copper pillars.

The copper layer in step 2 has a thickness of 2-10 microns.

The copper layer in step 2 is prepared by means of chemical deposition, electro-deposition or vapor deposition.

The outer metal pin and the metal circuit layer are made of copper, aluminum or nickel, and the anti-oxidant metal layer is made of gold, nickel-gold, nickel-palladium-gold or tin.

The plastic package adopts glue filling by a mold, spray-coating by a spraying device, filming or brush coating.

The etching in step 11 adopts an etching process using copper chloride or ferric chloride.

A package-then-etch three-dimensional package structure electrically connected by plated copper pillars includes a metal circuit layer. A conductive metal pillar is disposed on the front side of the metal circuit layer. A outer metal pin is disposed on the back side of the metal circuit layer. A peripheral region of the outer metal pin is encapsulated with a pre-encapsulating material. A chip is disposed on the metal circuit layer. Peripheral regions of the metal circuit layer, the conductive metal pillar and the chip are encapsulated with a first molding compound. The top end of the conductive metal pillar is exposed outside the first molding compound.

A first passive device is disposed at the top end of the conductive metal pillar through a welding flux. A peripheral region of the first passive device is encapsulated with a second molding compound.

The chip is a face-up chip or a flip chip.

A second passive device is disposed at one side of the chip.

A plurality of chips is provided.

Compared with the prior art, the present invention has the following advantages.

1. According to the three-dimensional package structure provided by the present invention, objects are embedded during manufacture of intermediate interlayers of a substrate. An active or passive component may be embedded into a required position or region according to system or functional demands. A packaged and integrated system has more functions. Thus, a component module with the same function takes up less space on a PCB. Thus, the cost is lowered and the packaging integration level is improved.

2. According to three-dimensional package structure provided by the present invention, all pin circuit layers are designed at one side of the metal carrier and encapsulated inside a product, such that oxidation caused by outside exposure is prevented. Accordingly, the packaging reliability is improved.

3. According to the three-dimensional package structure provided by the present invention, as packaging is performed at one side of the metal carrier and the metal carrier is reserved in the package process flow, a holding-back effect can be achieved when the molding compounds contract with cold. Thus, the entire package structure can be effectively prevented from warping and product breakage is reduced.

Figure 1:
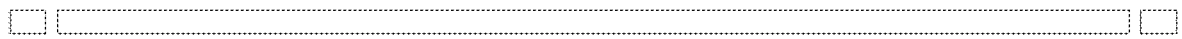
FIGS. 1-24 are schematic views of all procedures of a process of a package-then-etch three-dimensional package structure electrically connected by plated copper pillars according to Embodiment 1 of the present invention.

Reference numbers in the drawings are described as below: metal carrier—1; locating hole—2; copper layer—3; pre-encapsulating material—4; outer metal pin—5; conductive layer—6; metal circuit layer—7; metal bump—8; conductive metal pillar—9; first molding compound—10; flip chip—11; first passive device—12; second molding compound—13; face-up chip—14; metal wire—15; and second passive device—16.

DETAILED DESCRIPTION

The present invention will be further described in detail below with reference to the accompanying drawings.

Embodiment 1: Single Circuit Layer and Single Flip Chip

Figure 25:
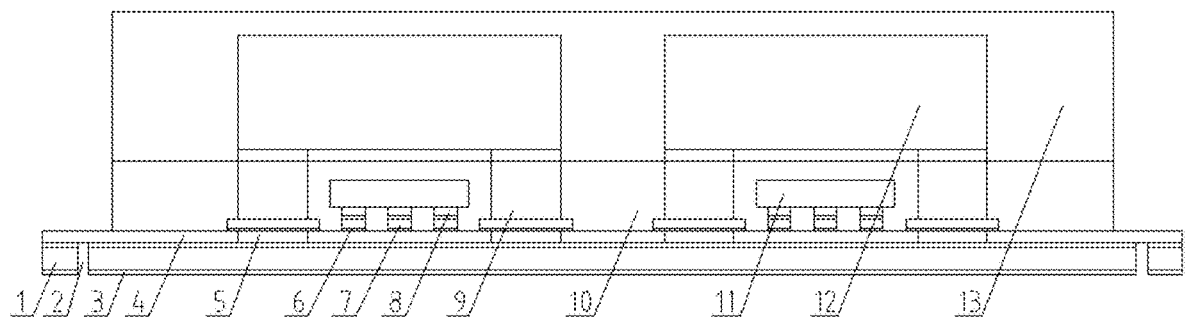
FIG. 25 is a schematic view of a package-then-etch three-dimensional package structure electrically connected by plated copper pillars according to Embodiment 1 of the present invention.

As shown in FIG. 25, a package-then-etch three-dimensional package structure electrically connected by plated copper pillars, provided by the embodiment, includes a metal circuit layer 7. A conductive metal pillar 9 is disposed on the front side of the metal circuit layer 7. A outer metal pin 5 is disposed on the back side of the metal circuit layer 7. A peripheral region of the outer metal pin 5 is encapsulated with a pre-encapsulating material 4. A flip chip 11 is disposed on the metal circuit layer 7 through a metal bump 8. Peripheral regions of the metal circuit layer 7, the conductive metal pillar 9 and the flip chip 11 are encapsulated with a first molding compound 10. The top end of the conductive metal pillar 9 is exposed outside the first molding compound 10. A first passive device 12 is disposed at the top end of the conductive metal pillar 9 through a welding flux. A peripheral region of the first passive device 12 is encapsulated with a second molding compound 13.

A process thereof includes the following steps.

In step 1, a metal carrier is taken.

Referring to FIG. 1, the metal carrier with an appropriate thickness is taken to support circuit manufacture and a circuit layer structure. The carrier is a plate mainly made of a metal material, such as a copper material, an iron material, a stainless steel material or other metallics with a conductive function.

In step 2, a surface of the metal carrier is preplated with a copper layer.

Figure 2:
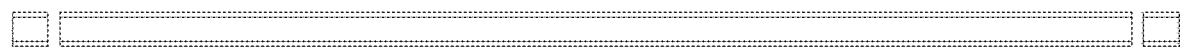

Referring to FIG. 2, the surface of the metal carrier is preplated with the copper layer having a thickness of 2-10 microns. The copper layer may be prepared by chemical deposition, electro-deposition or vapor deposition.

In step 3, photoetching is performed.

Figure 3:

Referring to FIG. 3, the front side and the back side of the metal carrier preplated with the copper layer are covered or printed with a photoresist material, which can be exposed and developed, to protect the follow-up electroplating process of a metal layer. An exposure and development device is utilized to expose, develop and remove part of the photoresist material on the surface of the metal carrier so as to expose a graphic region, which needs to be electroplated with an outer metal pin, on the surface of the metal carrier. The photoresist material may be a photoresist film or a photoresist.

In step 4, the outer metal pin is formed by electroplating.

Figure 4:

Referring to FIG. 4, the outer metal pin is formed in a region, in which the part of the photoresist material is removed in step 3, on the front side of the metal carrier by electroplating. The outer metal pin is usually made of copper, aluminum, nickel or the like, and may also be made of other conductive metallics.

In step 5, the photoresist material is removed.

Figure 5:
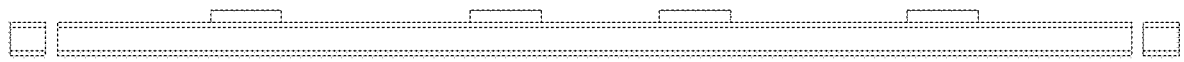

Referring to FIG. 5, the photoresist film on the surface of the metal carrier is removed by means of liquid chemical softening and high-pressure water flushing.

In step 6, plastic package is performed with epoxy resin.

Figure 6:
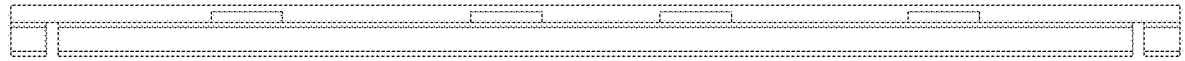

Referring to FIG. 6, the plastic package is performed with epoxy resin on a peripheral region of the outer metal pin on the front side of the metal carrier for protection. The epoxy resin may be that with or without a filler in accordance with product properties. The plastic package may adopt glue filling by a mold, spray-coating by a spraying device, filming or brush coating.

In step 7, surface grinding is performed.

Figure 7:
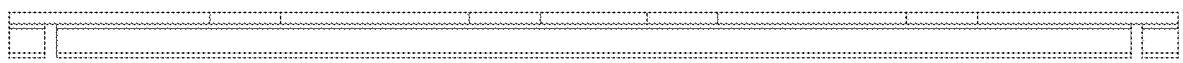

Referring to FIG. 7, after the plastic package is performed with the epoxy resin, the surface grinding is performed on the epoxy resin to enable the top end of the outer metal pin to be exposed outside a surface of a plastic package and to control the thickness of the epoxy resin.

In step 8, a conductive layer is prepared on the surface of the epoxy resin.

Figure 8:

Referring to FIG. 8, the conductive layer is prepared on the surface of the ground epoxy resin. The conductive layer may be made of a metallic substance, such as nickel, titanium, copper and silver, and may also be made from a non-metallic conductive polymeric material, such as polyaniline, polypyrrole and polythiophene. A deposition mode is usually chemical deposition, vapor deposition, sputtering or the like.

In step 9, photoetching is performed.

Figure 9:
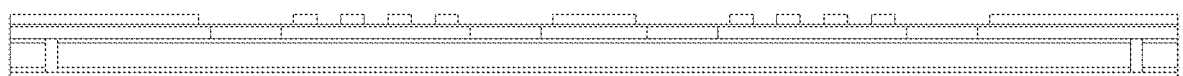

Referring to FIG. 9, the front side of the metal carrier in step 8 is covered or printed with a photoresist material which can be exposed and developed. An exposure and development device is utilized to expose, develop and remove part of the photoresist material to expose a graphic region, which needs to be electroplated with a metal circuit layer, on the surface of the metal carrier. The photoresist material may be a photoresist film or a photoresist.

In step 10, the metal circuit layer is formed by electroplating.

Figure 10:

Referring to FIG. 10, the metal circuit layer is formed in a region, in which the part of the photoresist material is removed in step 9, on the front side of the metal carrier by electroplating. The metal circuit layer is usually made of copper, aluminum, nickel or the like and may also be made of other conductive metallics.

In step 11, photoetching is performed.

Figure 11:
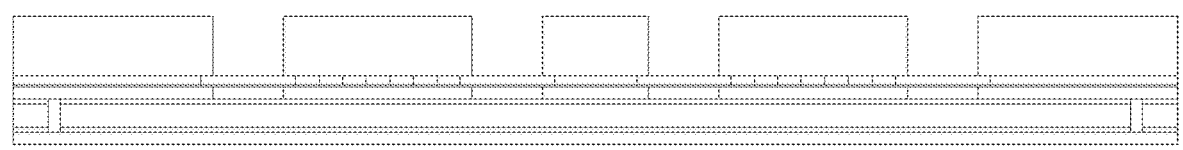

Referring to FIG. 11, the front side of the metal carrier in step 10 is covered or printed with a photoresist material which can be exposed and developed. An exposure and development device is utilized to expose, develop and remove part of the photoresist material to expose a graphic region, which needs to be electroplated with a conductive metal pillar, on the surface of the metal carrier. The photoresist material may be a photoresist film or a photoresist.

In step 12, the conductive metal pillar is formed by electroplating.

Figure 12:
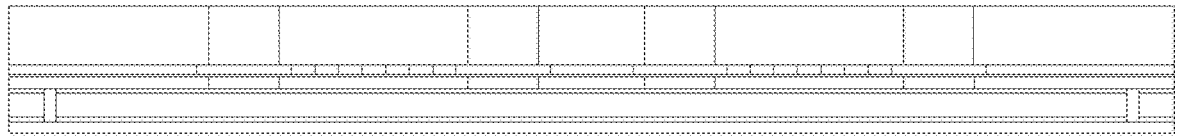

Referring to FIG. 12, the conductive metal pillar is formed in a region, in which the part of the photoresist material is removed in step 11, on the front side of the metal carrier. The conductive metal pillar is configured for conduction and connection inside the three-dimensional package structure.

In step 13, the photoresist material is removed.

Figure 13:
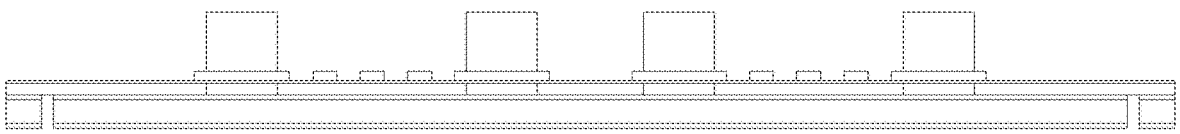

Referring to FIG. 13, the photoresist film on the surface of the metal carrier is removed by means of liquid chemical softening and high-pressure water flushing.

In step 14, rapid etching is performed.

Figure 14:
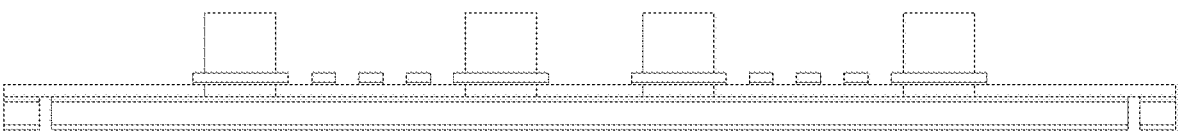

Referring to FIG. 14, the conductive layer exposed on the front side of the metal carrier is removed.

In step 15, a chip is inversely mounted.

Figure 15:
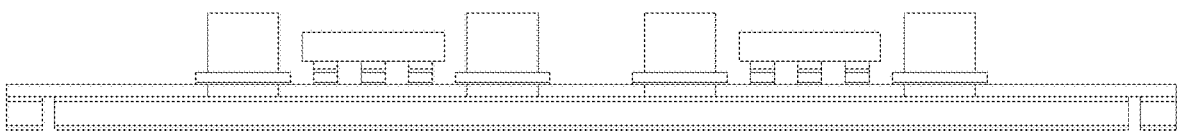

Referring to FIG. 15, the chip is inversely mounted on the metal circuit layer.

In step 16, plastic package is performed.

Figure 16:
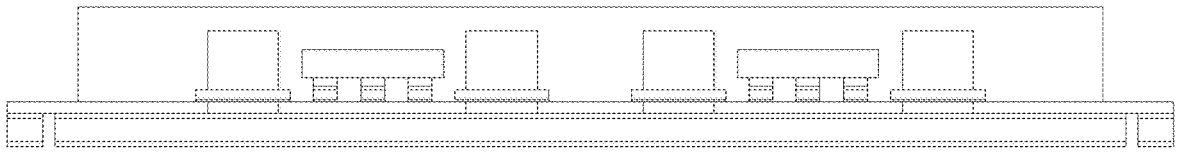

Referring to FIG. 16, the plastic package is performed on the front side of the metal carrier in step 15 through a molding compound. The plastic package may adopt glue filling by a mold, compression glue filling, spray-coating or filming. The molding compound may be epoxy resin with or without a filling substance.

In step 17, surface grinding is performed.

Figure 17:
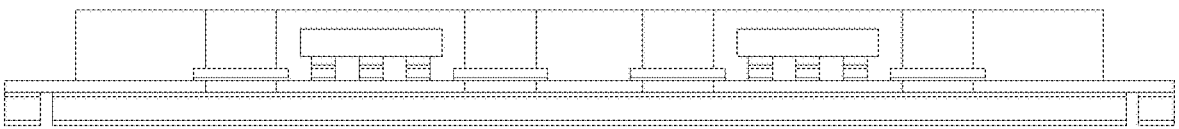

Referring to FIG. 17, after the plastic package is performed with the epoxy resin, the surface grinding is performed on the epoxy resin to enable the top end of the conductive metal pillar prepared in step 12 to be exposed outside a surface of a plastic package and to control the thickness of the epoxy resin.

In step 18, a passive device is surface-mounted.

Figure 18:
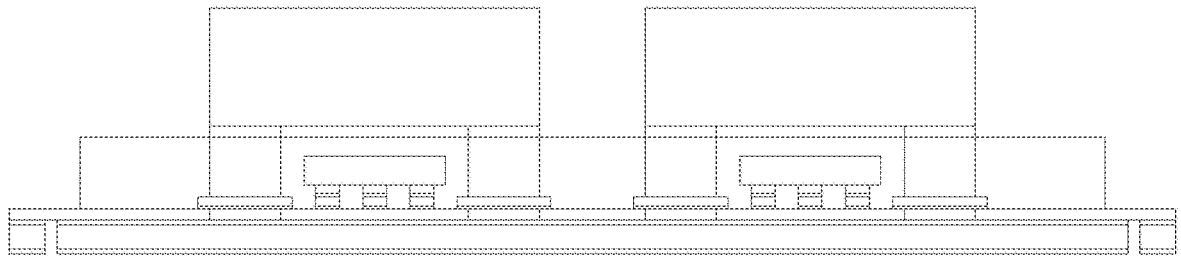

Referring to FIG. 18, the passive device is surface-mounted at the top end of the conductive metal pillar, exposed in step 17.

In step 19, plastic package is performed.

Figure 19:
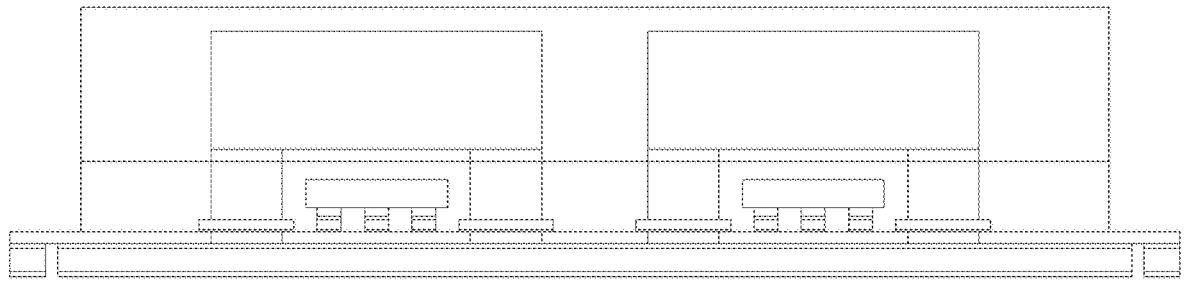

Referring to FIG. 19, the plastic package is performed on the front side of the metal carrier in step 18 through a molding compound. The plastic package may adopt glue filling by a mold, compression glue filling, spray-coating or filming. The molding compound may be epoxy resin with or without a filling substance.

In step 20, photoetching is performed.

Figure 20:
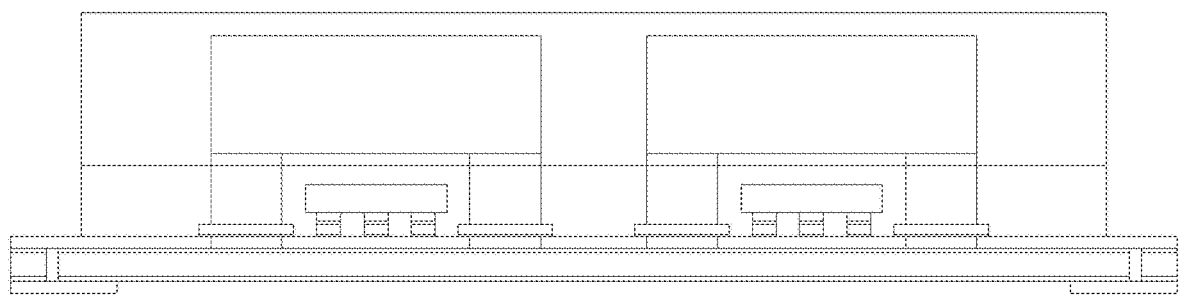

Referring to FIG. 20, the back side of the metal carrier in step 19 is covered or printed with a photoresist material, which can be exposed and developed. An exposure and development device is utilized to expose, develop and remove part of the photoresist material to expose a graphic region, which needs to be etched, on the surface of the metal carrier. The photoresist material may be a photoresist film or a photoresist.

In step 21, the carrier is etched.

Figure 21:
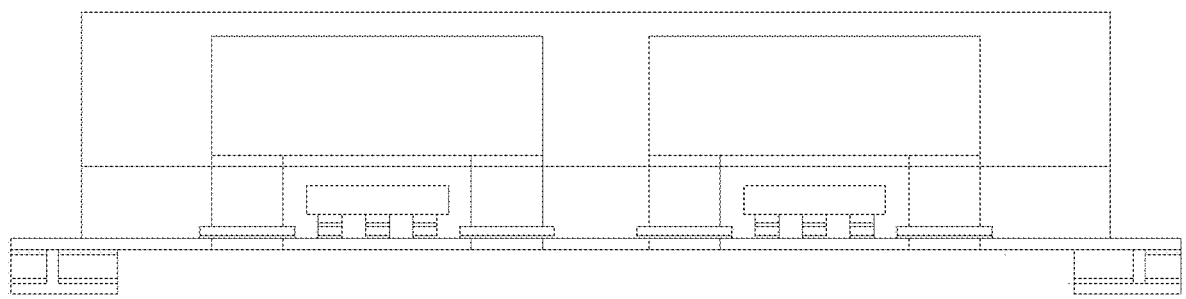

Referring to FIG. 21, a region, in which the part of the photoresist material is removed in step 20, on the back side of the metal carrier is chemically etched and windowed. The etching method may be an etching process using copper chloride or ferric chloride.

In step 22, the photoresist material is removed.

Figure 22:
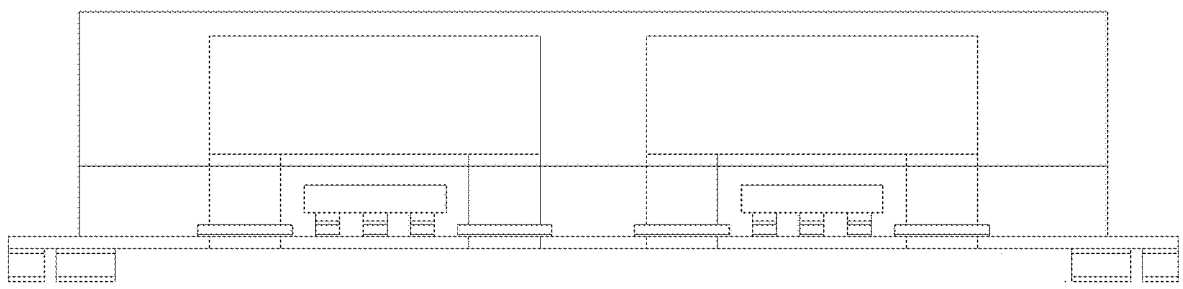
Figure 23:
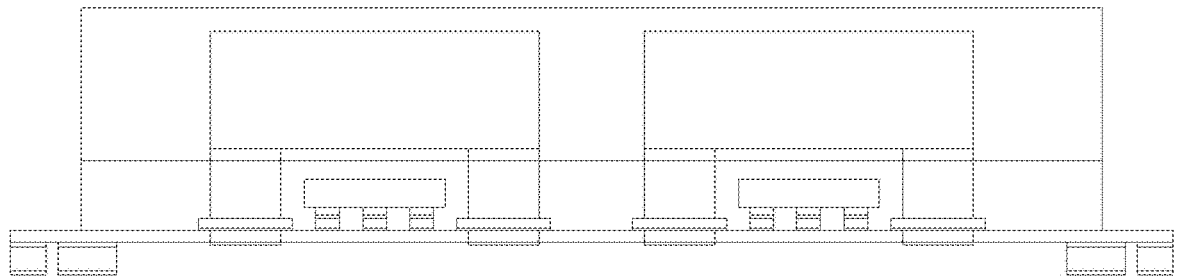

Referring to FIG. 22, the photoresist film on the surface of the metal carrier may be removed by means of liquid chemical softening and high-pressure water flushing.

In step 23, an anti-oxidant metal layer is formed by electroplating.

Referring to FIG. 22, after the photoresist material is removed in step 22, the exposed metal surface of the metal carrier is electroplated with the anti-oxidant metal layer made of gold, nickel-gold, nickel-palladium-gold, tin or the like.

In step 24, cutting is performed to obtain a finished product.

Figure 24:
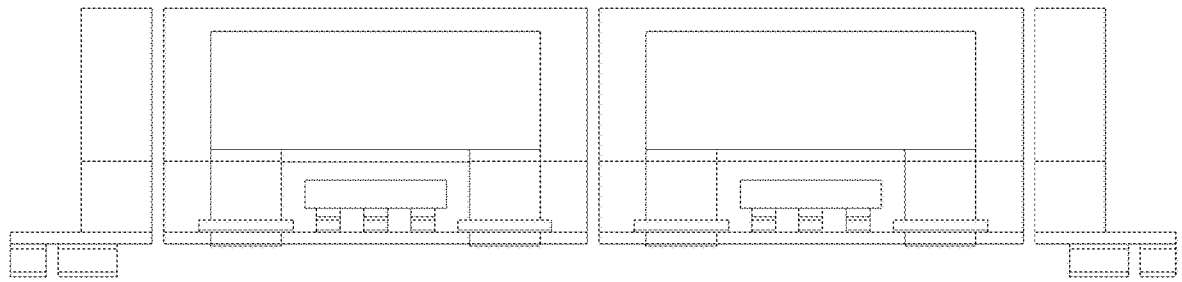

Referring to FIG. 24, a semi-finished product electroplated with the anti-oxidant metal layer in step 23 is cut, such that plastic package modules which are integrated by means of array aggregation are independently cut off to produce the finished product of the package-then-etch three-dimensional package structure electrically connected by the plated copper pillars.

Figure 26:
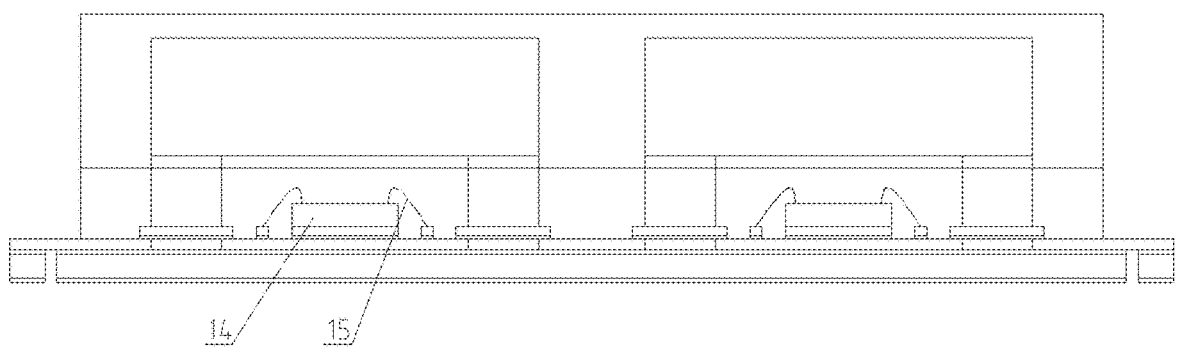
FIG. 26 is a schematic view of a package-then-etch three-dimensional package structure electrically connected by plated copper pillars according to Embodiment 2 of the present invention.

Embodiment 2: Single Circuit Layer, Single Face-Up Chip and Stacked Passive Device Referring to FIG. 26, Embodiment 2 differs from Embodiment 1 in that the flip chip 11 on the front side of the metal circuit layer 7 is replaced with a face-up chip 14 and the face-up chip 14 and the metal circuit layer 7 are connected through a metal wire 15.

Figure 27:
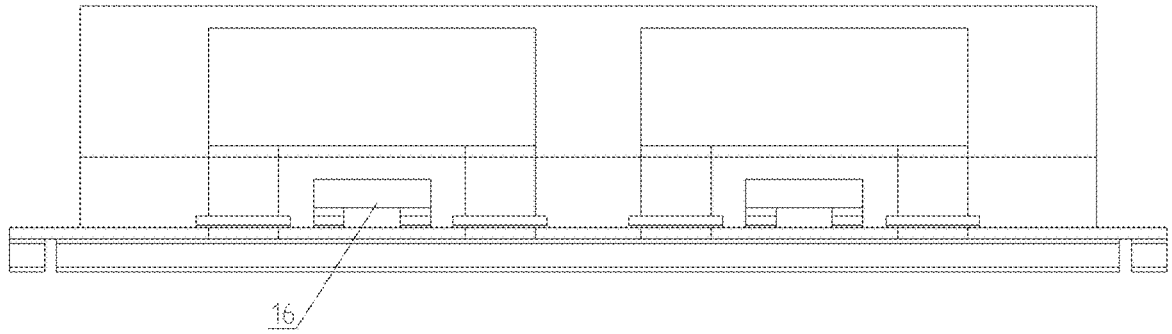
FIG. 27 is a schematic view of a package-then-etch three-dimensional package structure electrically connected by plated copper pillars according to Embodiment 3 of the present invention.

Embodiment 3: Single Circuit Layer, Single Passive Device and Stacked Passive Device Referring to FIG. 27, Embodiment 3 differs from Embodiment 1 in that the flip chip 11 on the front side of the metal circuit layer 7 is replaced with a second passive device 16.

Figure 28:
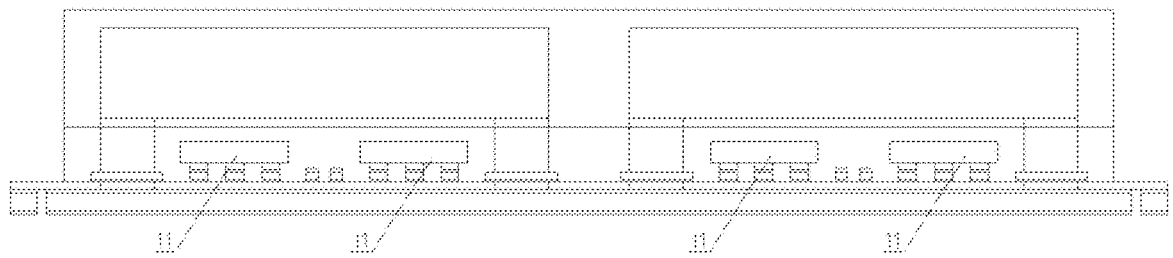
FIG. 28 is a schematic view of a package-then-etch three-dimensional package structure electrically connected by plated copper pillars according to Embodiment 4 of the present invention.

Embodiment 4: single circuit layer, a plurality of flip chips and stacked passive device Referring to FIG. 28, Embodiment 4 differs from Embodiment 1 in that a plurality of flip chips 11 is provided.

Figure 29:
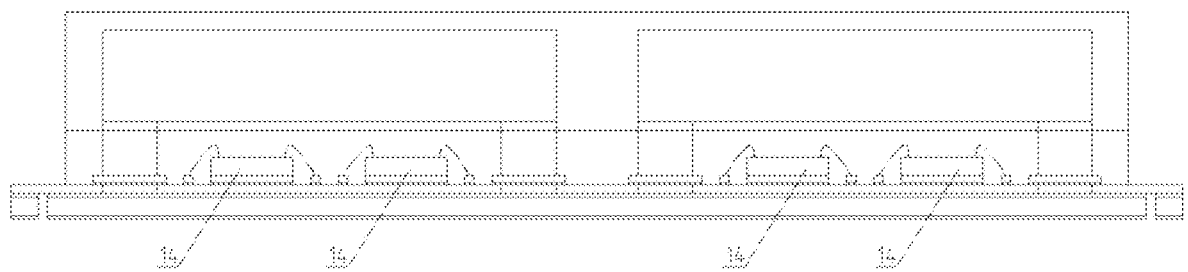
FIG. 29 is a schematic view of a package-then-etch three-dimensional package structure electrically connected by plated copper pillars according to Embodiment 5 of the present invention.

Embodiment 5: single circuit layer, a plurality of face-up chips and stacked passive device Referring to FIG. 29, Embodiment 5 differs from Embodiment 2 in that a plurality of face-up chips 14 is provided.

Figure 30:
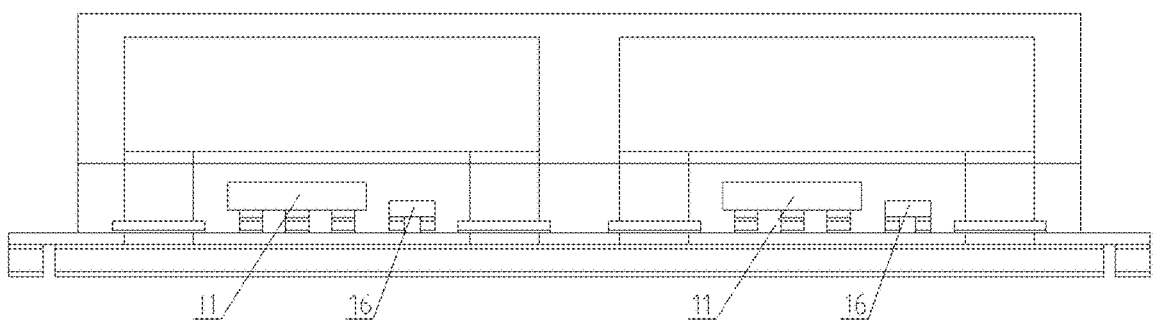
FIG. 30 is a schematic view of a package-then-etch three-dimensional package structure electrically connected by plated copper pillars according to Embodiment 6 of the present invention.

Embodiment 6: single circuit layer and face-up chip+passive device and stacked passive device Referring to FIG. 30, Embodiment 6 differs from Embodiment 1 in that a second passive device 16 is disposed at one side of the flip chip 11.

Figure 31:
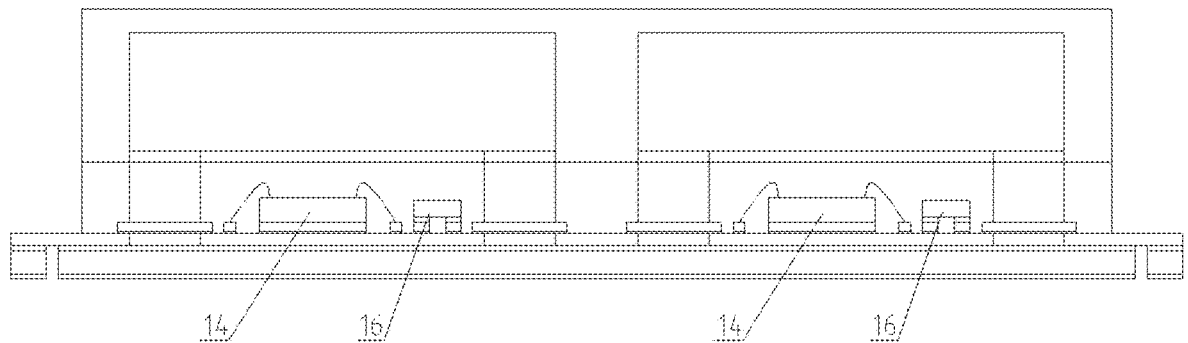
FIG. 31 is a schematic view of a package-then-etch three-dimensional package structure electrically connected by plated copper pillars according to Embodiment 7 of the present invention.

Embodiment 7: single circuit layer and flip chip+passive device and stacked passive device Referring to FIG. 31, Embodiment 7 differs from Embodiment 2 in that a second passive device 16 is disposed at one side of the face-up chip 14.

Figure 32:
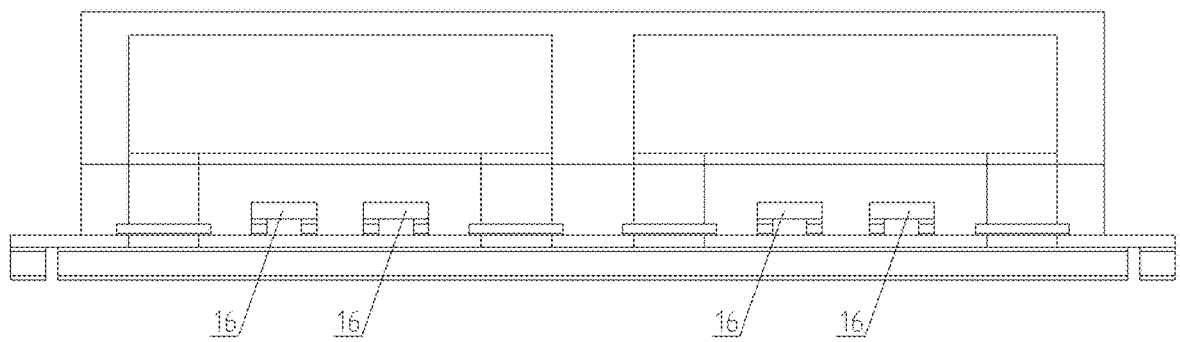
FIG. 32 is a schematic view of a package-then-etch three-dimensional package structure electrically connected by plated copper pillars according to Embodiment 8 of the present invention.

Embodiment 8: single circuit layer, a plurality of passive devices and stacked passive device Referring to FIG. 32, Embodiment 8 differs from Embodiment 3 in that a plurality of second passive devices 16 is provided.

In addition to the above-described embodiments, the present invention further includes other embodiments, and any technical solution formed by equivalent transformations or equivalent substitutions should fall within the protection scope defined by the claims of the present invention.

What is claimed is:

1. A process of making a package-then-etch three-dimensional package structure electrically connected by plated copper pillars, comprising:
   placing a metal carrier;
   preplating a surface of the metal carrier with a copper layer;
   forming an outer metal pin on a front side of the metal carrier by means of electroplating;
   performing plastic packaging on a peripheral region of the outer metal pin with a first molding compound, and enabling a top end of the outer metal pin to be exposed outside a surface of the first molding compound by means of surface grinding;
   forming a metal circuit layer on the surface of the first molding compound by means of electroplating;
   forming a conductive metal pillar on a surface of the metal circuit layer by means of electroplating;
   surface-mounting a chip on the surface of the metal circuit layer;
   performing plastic packaging on peripheral regions of the metal circuit layer, the conductive metal pillar and the chip with a second molding compound, and enabling a top end of the conductive metal pillar to be exposed outside a surface of the second molding compound by means of surface grinding;
   surface-mounting a passive device at the top end of the conductive metal pillar exposed;
   performing plastic packaging on a peripheral region of the passive device by a third molding compound;
   etching and windowing a back side of the metal carrier to expose a back side of the outer metal pin;
   forming an anti-oxidant metal layer on the exposed back side of the outer metal pin by means of electroplating; and
   cutting a semi-finished product electroplated with the anti-oxidant metal layer, such that plastic package modules which are integrated by means of array aggregation are independently cut off to produce a finished product of the package-then-etch three-dimensional package structure electrically connected by the plated copper pillars.

2. The process according to claim 1, wherein the copper layer has a thickness of 2-10 microns.

3. The process according to claim 1, wherein the copper layer is prepared by means of chemical deposition, electro-deposition or vapor deposition.

4. The process according to claim 1, wherein the outer metal pin and the metal circuit layer are made of copper, aluminum or nickel, and the anti-oxidant metal layer is made of gold, nickel-gold, nickel-palladium-gold or tin.

5. The process according to claim 1, wherein the plastic package adopts glue filling by a mold, spray-coating by a spraying device, filming or brush coating.

6. The process according to claim 1, wherein a first passive device and/or a second passive device are provided.

7. The process according to claim 1, wherein a plurality of chips are provided.

8. The process according to claim 1, wherein the first molding compound, the second molding compound and the third molding compound can be the same or different.

9. A process of making a package-then-etch three-dimensional package structure electrically connected by plated copper pillars, comprising:
   forming an outer metal pin on a front side of a metal carrier;
   performing plastic packaging on a peripheral region of the outer metal pin and enabling a top end of the outer metal pin to be exposed outside a surface of a first molding compound;
   forming a metal circuit layer on the surface of the first molding compound;
   forming a conductive metal pillar on a surface of the metal circuit layer and mounting a chip on the surface of the metal circuit layer;
   performing plastic packaging on peripheral regions of the metal circuit layer, the conductive metal pillar and the chip, and enabling a top end of the conductive metal pillar to be exposed outside a surface of a second molding compound;

surface-mounting a passive device at the top end of the conductive metal pillar exposed;

performing plastic packaging on a peripheral region of the passive device;

producing a finished product of the package-then-etch three-dimensional package structure by cutting.

10. The process according to claim 9, wherein after performing plastic packaging on a peripheral region of the passive device, the process further comprising:

etching and windowing a back side of the metal carrier to expose a back side of the outer metal pin; and forming an anti-oxidant metal layer on the exposed back side of the outer metal pin.

11. The process according to claim 10, wherein before forming an outer metal pin on the front side of a metal carrier, the process further comprising:

preplating a surface of the metal carrier with a copper layer.

12. The process according to claim 11, wherein the copper layer has a thickness of 2-10 microns.

13. The process according to claim 11, wherein the copper layer is prepared by means of chemical deposition, electro-deposition or vapor deposition.

14. The process according to claim 9, wherein the outer metal pin and the metal circuit layer are made of copper, aluminum or nickel, and the anti-oxidant metal layer is made of gold, nickel-gold, nickel-palladium-gold or tin.

15. The process according to claim 9, wherein the plastic package adopts glue filling by a mold, spray-coating by a spraying device, filming or brush coating.

16. The process according to claim 9, wherein a first passive device and/or a second passive device are provided.

17. The process according to claim 9, wherein a plurality of chips are provided.

18. The process according to claim 9, wherein the first molding compound and the second molding compound can be the same or different.

* * * * *